(12) United States Patent
Hobbs et al.

(10) Patent No.: US 7,999,375 B2
(45) Date of Patent: Aug. 16, 2011

(54) ELECTRONIC DEVICE WITH INTEGRATED MICROMECHANICAL CONTACTS AND COOLING SYSTEM

(75) Inventors: Eric D. Hobbs, Livermore, CA (US); Gaetan L. Mathieu, Varennes (CA)

(73) Assignee: FormFactor, Inc., Livermore, CA (US)

( * ) Notice: Subject to any disclaimer, the term of this patent is extended or adjusted under 35 U.S.C. 154(b) by 775 days.

(21) Appl. No.: 11/548,668

(22) Filed: Oct. 11, 2006

(65) Prior Publication Data
US 2008/0088010 A1    Apr. 17, 2008

(51) Int. Cl.
*H01L 23/34* (2006.01)
(52) U.S. Cl. .......................... 257/714; 257/716; 257/717
(58) Field of Classification Search .................. 257/714, 257/716, 717
See application file for complete search history.

(56) References Cited

U.S. PATENT DOCUMENTS

| | | | |
|---|---|---|---|
| 4,730,665 A * | 3/1988 | Cutchaw | 165/80.4 |
| 5,150,274 A * | 9/1992 | Okada et al. | 361/703 |
| 5,436,501 A * | 7/1995 | Ikeda | 257/714 |
| 6,550,263 B2 * | 4/2003 | Patel et al. | 62/259.2 |
| 6,664,649 B2 * | 12/2003 | Huang | 257/796 |
| 6,891,385 B2 | 5/2005 | Miller | |
| 7,064,953 B2 | 6/2006 | Miller | |
| 7,433,188 B2 | 10/2008 | Miller | |
| 7,579,847 B2 | 8/2009 | Miller | |
| 2004/0113265 A1 * | 6/2004 | DiBattista et al. | 257/714 |
| 2005/0093957 A1 | 5/2005 | Gibson et al. | |
| 2005/0139996 A1 | 6/2005 | Myers et al. | |
| 2005/0206397 A1 | 9/2005 | Miller | |
| 2007/0063337 A1 * | 3/2007 | Schubert et al. | 257/714 |
| 2007/0141743 A1 | 6/2007 | Mathieu et al. | |
| 2007/0265795 A1 | 11/2007 | Mathieu | |
| 2009/0032938 A1 | 2/2009 | Miller | |

OTHER PUBLICATIONS

"ProMetal 3-D Printing Process," ProMetal division of The Ex One Company (Irwin, Pennsylvania), 2 pages, date of first publication unknown, submitted pages printed from http://www.prometal.com/process.html on Apr. 20, 2006.
"ProMetal Equipment," ProMetal division of The Ex One Company (Irwin, Pennsylvania), 2 pages, date of first publication unknown, submitted pages printed from http://www.prometal.com/equipment.html on Apr. 20, 2006.
"Welcome to the ink-jet age" ZDNet.co.uk of CNET Networks, 5 pages, submitted pages printed from http://news.zdnet.co.uk.
"Epson Inkjet Technology Used to Fabricate World's First Ultra-Thin Multilayer Circuit Board", News Release, Nov. 1, 2004, 2 pages, submitted pages printed from http://www.epson.co.jp.
Butterfield, "The Print Shop: Sci-Fi Inkjet Printers" on-line article, Mar. 1, 2005, 2 pages, submitted pages printed from http://www.pcworld.com.
Canny et al., "Flexonics," Electrical Engineering and Computer Sciences, University of California, Berkeley, pp. 1-17, Dec. 14-17, 2002.
Gay, "Direct Writing Global status and opportunities for the UK in advanced manufacturing," Crown, Feb. 2004, pp. i-vii and 1-1 through 6-1.

(Continued)

*Primary Examiner* — Howard Weiss
*Assistant Examiner* — Tifney L Skyles
(74) *Attorney, Agent, or Firm* — Kirton & McConkie

(57) ABSTRACT

An electronic device can comprise a semiconductor die on which can be formed a micromechanical system. The micromechanical system can comprise a plurality of electrically conductive elongate, contact structures, which can be disposed on input and/or output terminals of the semiconductor die. The micromechanical system can also comprise a cooling structure disposed on the semiconductor die.

20 Claims, 9 Drawing Sheets

OTHER PUBLICATIONS

Graham-Rowe, "'Gadget printer' promises industrial revolution," New Scientist, 2 pages, Jan. 2003.

Lipson, "Homemade," IEEE Spectrum, pp. 24-31, May 2005.

Nozawa, "Epson Prints 20-Layer Board with Inkjet Technology" Feb. 2005, Nikkei Electronics Asia, Nikkei Business Publications, Inc., submitted pages printed from http://www.techhon.nikkeibp.co.jp.

Pamula et al., "Cooling of Integrated Circuits Using Droplet-Based Microfluidics," GLSVLSI '03 (Apr. 28-29, 2003) (ACM 1-58113-677-3/03/0004).

Wohlers, "A Year Filled With Promising R&D," Time-Compression Technologies Magazine, 4 pages, Nov./Dec. 2002, Wohlers Associates.

U.S. Appl. No. 12/547,260, filed Aug. 25, 2009, Miller.

* cited by examiner

ELECTRONIC DEVICE WITH INTEGRATED MICROMECHANICAL CONTACTS AND COOLING SYSTEM

BACKGROUND

It has been known to fabricate integrated electronic circuits into a semiconductor material. Typically, many integrated circuits are fabricated as dies on a semiconductor wafer, after which the dies can be singulated into individual dies and utilized in electronics systems. The present invention is directed to novel uses, applications of, and improved processes for making microstructures on electronic devices, such as semiconductor dies.

SUMMARY

In some embodiments of the invention, an electronic device can comprise a semiconductor die on which can be formed a micromechanical system. The micromechanical system can comprise a plurality of electrically conductive elongate, contact structures, which can be disposed on input and/or output terminals of the die. The micromechanical system can also comprise a cooling structure disposed on the die.

In some embodiments of the invention, a method of making a cooling system on an electronic device can comprise forming a three-dimensional array of droplets on the electronic device. The array can comprise droplets that form a support structure. The method can further comprise forming a fluid channel on the electronic device by depositing a material composing the fluid channel onto the support structure.

In some embodiments of the invention, a method of processing semiconductor dies can comprise depositing a plurality of layers of droplets on the dies of an unsingulated semiconductor wafer. The droplets can comprise droplets of a first material disposed to form a plurality of support structures on each of the dies and droplets of a second material. The method can further comprise removing the droplets of the second material to expose the support structures, and forming a micromechanical system on each of the dies by depositing a third material onto the support structures. The micromechanical system formed on each die can comprise a fluid channel disposed on a surface of the die and a plurality of contact structures disposed on input and/or output terminals of the die.

DETAILED DESCRIPTION OF EXEMPLARY EMBODIMENTS

This specification describes exemplary embodiments and application of the invention. The invention is, however, not limited to these exemplary embodiments and applications, or to the manner in which the exemplary embodiments and applications operate or are described herein. Moreover, the figures may show simplified or partial views, and the elements and the figures may be exaggerated or otherwise not proportioned for ease of illustration or clarity.

As the term "on" is used herein, one object (e.g., material, layer, substrate, etc.) can be "on" another object regardless of whether the one object is directly on the other object or there are one or more intervening objects between the one object and the other object. Additionally directions (e.g., above, below, top, bottom, side, "x", "y", "z", etc.), provided are relative and provided solely by way of example and for ease of illustration and discussion, and not by way of limitation.

Figure 1:
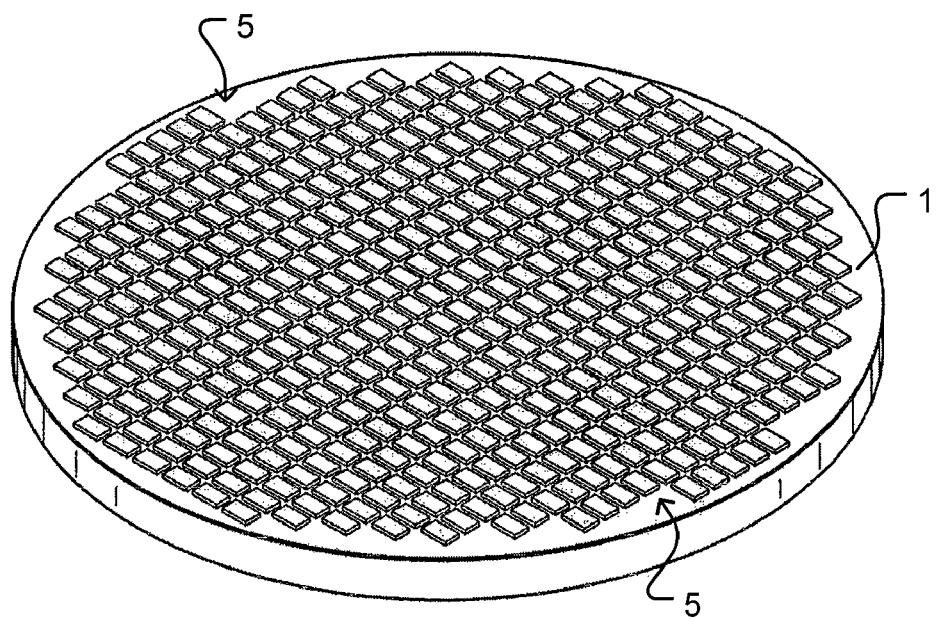
FIG. 1 illustrates an exemplary semiconductor wafer with exemplary dies fabricated on the wafer.
Figure 2:
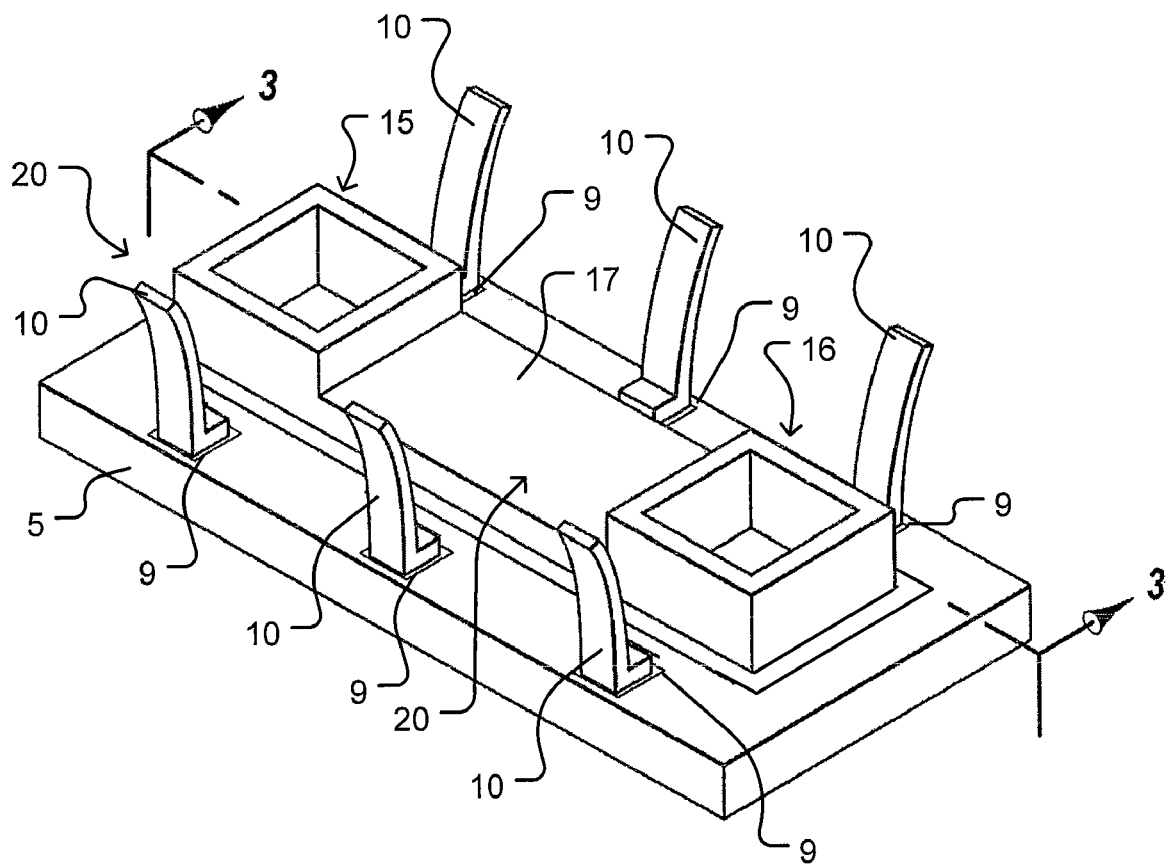
FIG. 2 illustrates an exemplary die of FIG. 1 with an exemplary micromechanical cooling structure and electrical contact structures according to some embodiments of the invention.
Figure 3:
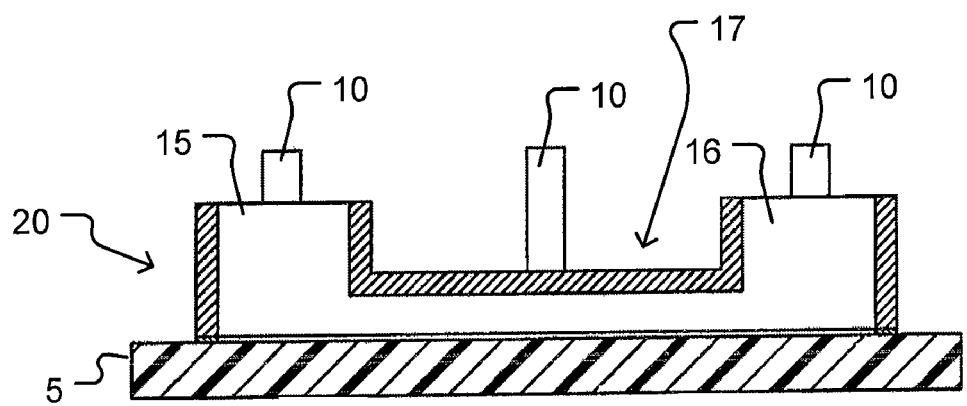
FIG. 3 illustrates a cross-sectional view of the exemplary die of FIG. 2.

FIG. 1 illustrates an exemplary semiconductor wafer 1 on which have been fabricated a plurality of dies 5 as is known in the field, and FIGS. 2 and 3 illustrate one of the dies 5 of FIG. 1 on which has been constructed exemplary micromechanical structures, including electrical conductive spring contact structures 10 and a cooling structure 20, according to some embodiments of the invention. As is known, the die 5 can comprise a base substrate of a semiconductor material (e.g., silicon) into which an electronic circuit or circuits (not shown) are integrated. As shown, the die 5 can include a plurality of electrically conductive input and/or output terminals 9 (six are shown but more or fewer can be utilized) that provide signal input and/or output to the circuitry of the die 5. Terminals 9 can be, for example, bond pads.

As shown in FIGS. 2 and 3, the micromechanical structures formed on die 5 can include elongate spring contact structures 10, which can be electrically conductive and attached to the terminals 9 to electrically connect the die to other electronic devices, such as a wiring substrate (e.g., a printed circuit board) (not shown), other dies (not shown), etc.

The micromechanical structures formed on die 5 can also include a cooling structure 20. As illustrated, the cooling structure 20 can comprise ports 15, 16, which can be configured as an inlet port 15 and an outlet port 16 that are fluidly connected by an integrated chamber 17. According to some embodiments of the invention, fluids and/or gases may be allowed to circulate or ventilate into the inlet port 15 through the integrated chamber 17 and exit out the outlet port 16. The fluid or gas can be used to cool the die 5. Indeed, because the chamber can be fabricated on an active portion of the die 5

(e.g., a portion of the die 5 on which circuitry has been fabricated), the fluid or gas can directly cool part or all of the circuitry on the die 5. For example, as shown in FIG. 3, the chamber 17 can be formed in part by a surface of the die 5. For example, the chamber 17 can be formed in part by a surface of the die 5 into which circuitry has been integrated.

In other embodiments of the invention, not illustrated, a fluid or gas may be disposed inside the integrated chamber 17 and the ports 15, 16 sealed preventing the fluid or gas from escaping. Accordingly in some embodiments, the integrated chamber 17 may be completely enclosed. In other embodiments, the cooling structure 20 may comprise an integrated chamber 17 and one port (e.g., like 15, 16). In other embodiments, the cooling structure 20 may comprise an integrated chamber 17 and more than two ports (e.g., like 15, 16).

Figure 4:
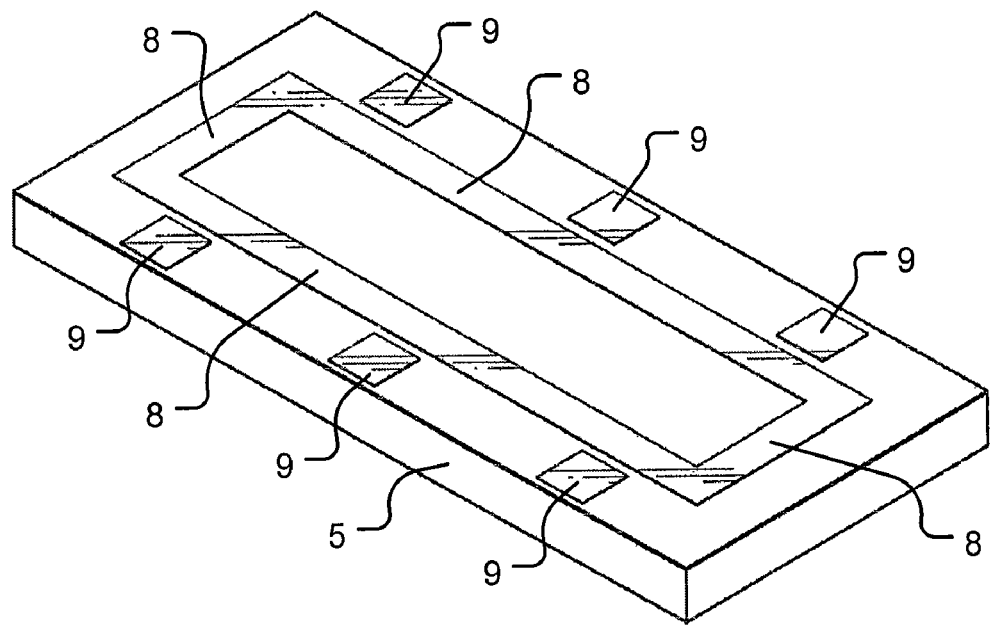
FIG. 4 illustrates a die with input/output terminals and an electrically conductive base according to some embodiments of the invention.

FIGS. 4-10 illustrate an exemplary process for making the spring contact structures 10 and cooling structure 20 of FIGS. 2 and 3 on a die 5 according to some embodiments. FIG. 4 illustrates a die 5 with input and/or output terminals 9 (six are shown but more or fewer can be provided). As mentioned above, the contact structures 10 and the cooling structures 20 can be fabricated on the die 5 before or after the die 5 is singulated from the wafer 1 (see FIG. 1). Thus, the die 5 shown in FIG. 4 can be part of the unsingulated wafer 1 or can be a separated die 5 singulated from the wafer 1. If die 5 is part of the unsingulated wafer 1, similar contact structures 10 and cooling structures 20 and/or other micromechanical structures can be simultaneously or sequentially fabricated on a plurality or all of the dies 5 of the wafer 1. Similarly, if die 5 is singulated, the die 5 can nevertheless be processed with other singulated dies such that similar contact structures 10 and cooling structures 20 and/or other micromechanical structures can be simultaneously or sequentially fabricated on a plurality of the dies 5.

As shown in FIG. 4, an electrically conductive base 8 can be provided or fabricated on the die 5. As will be seen, the base 8 can facilitate electrodeposition of materials forming the cooling structure 20. The base 8 can comprise one or more electronically conductive materials. For example, the base 8 can comprise strips of conductive material that are adhered (e.g. glued) or otherwise fastened to the die 5. As another example, material forming the base 8, can be deposited onto the die 5. For example, one or more materials comprising the base 8 can be deposited onto the die 5 using electroplating, chemical vapor deposition, physical vapor deposition, sputter deposition, electroless plating, electron beam deposition, evaporation (e.g., thermal evaporation), flame spray coating, plasma spray coating, ionic plating, etc. As yet another example, the base 8 can be formed by depositing a conductive paste or pastes onto the die 5 and then curing or otherwise allowing the paste or pastes to harden and form the base 8. The paste or pastes composing the base 8 can be deposited onto the die 5 in a desired shape of the base 8, or the paste or pastes can be patterned after being deposited onto the die 5. For example, portions of the paste or pastes deposited onto the die 5 can be removed to shape the portions of the paste or pastes on the die 5 in a desired form of the base 8.

Figure 5:
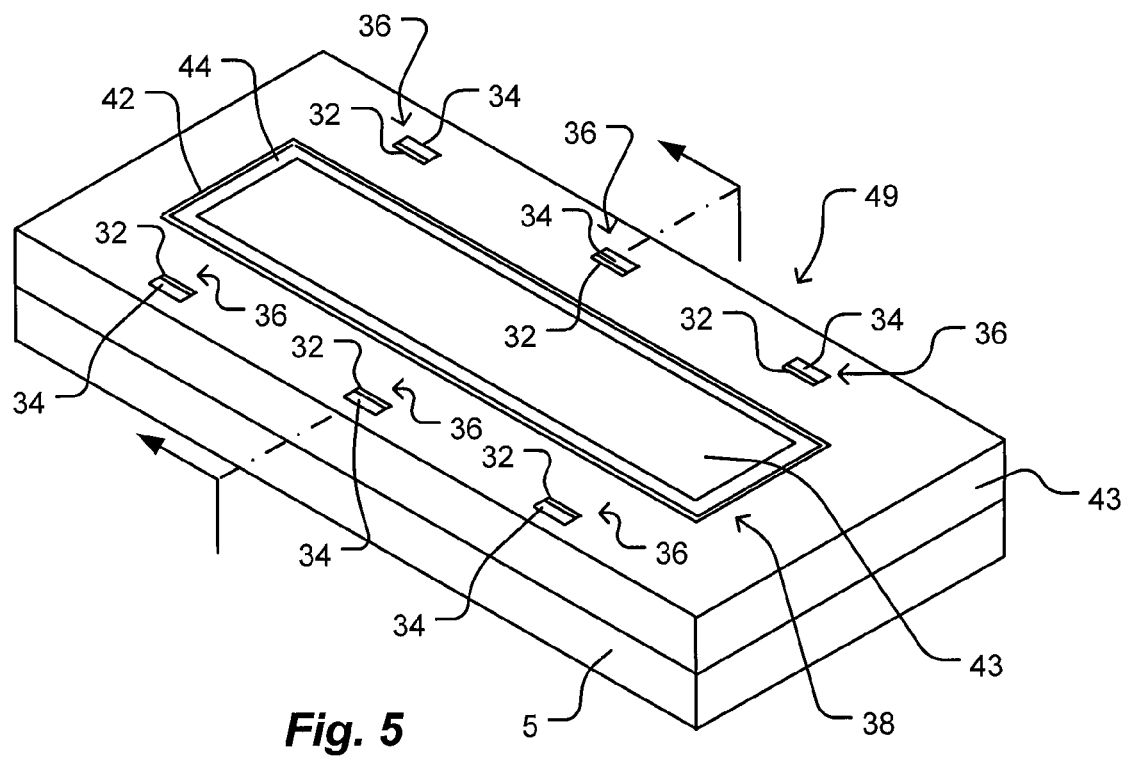
FIG. 5 illustrates the die of FIG. 4 after deposition of a plurality of layers of droplets forming a partial array of the droplets according to some embodiments of the invention.
Figure 6:
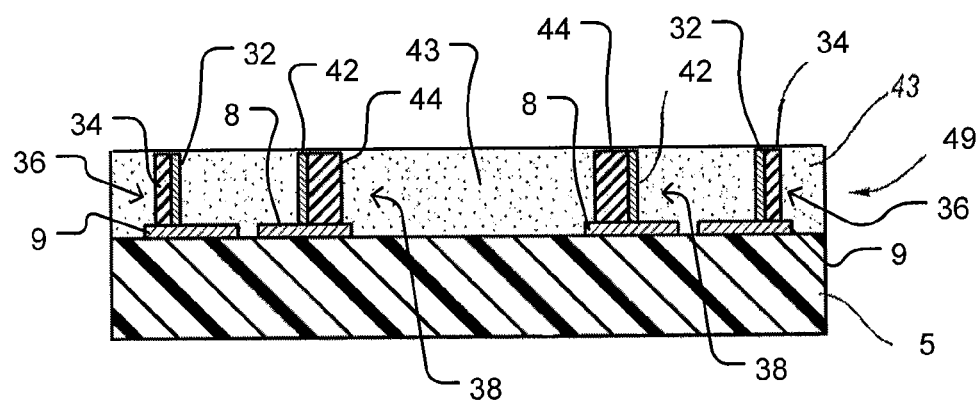
FIG. 6 illustrates a cross-sectional view of the die of FIG. 5.
Figure 7:
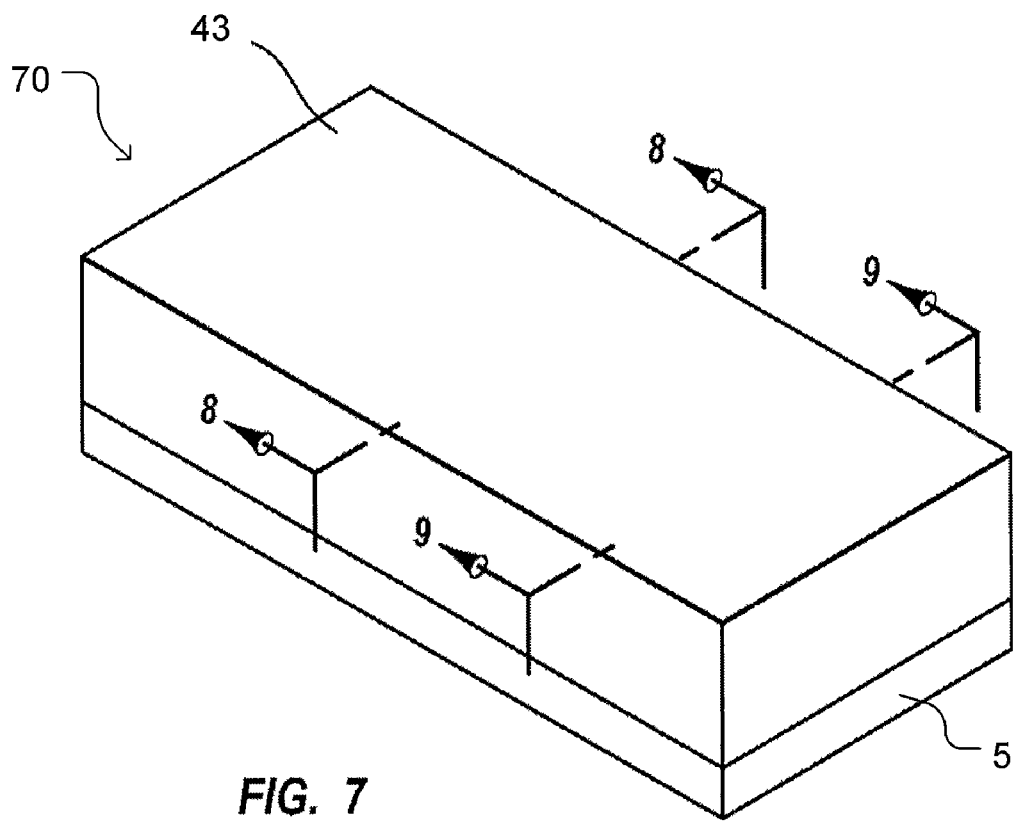
FIG. 7 illustrates the die of FIG. 5 after deposition of additional layers of droplets forming a full array of the droplets according to some embodiments of the invention.
Figure 8:
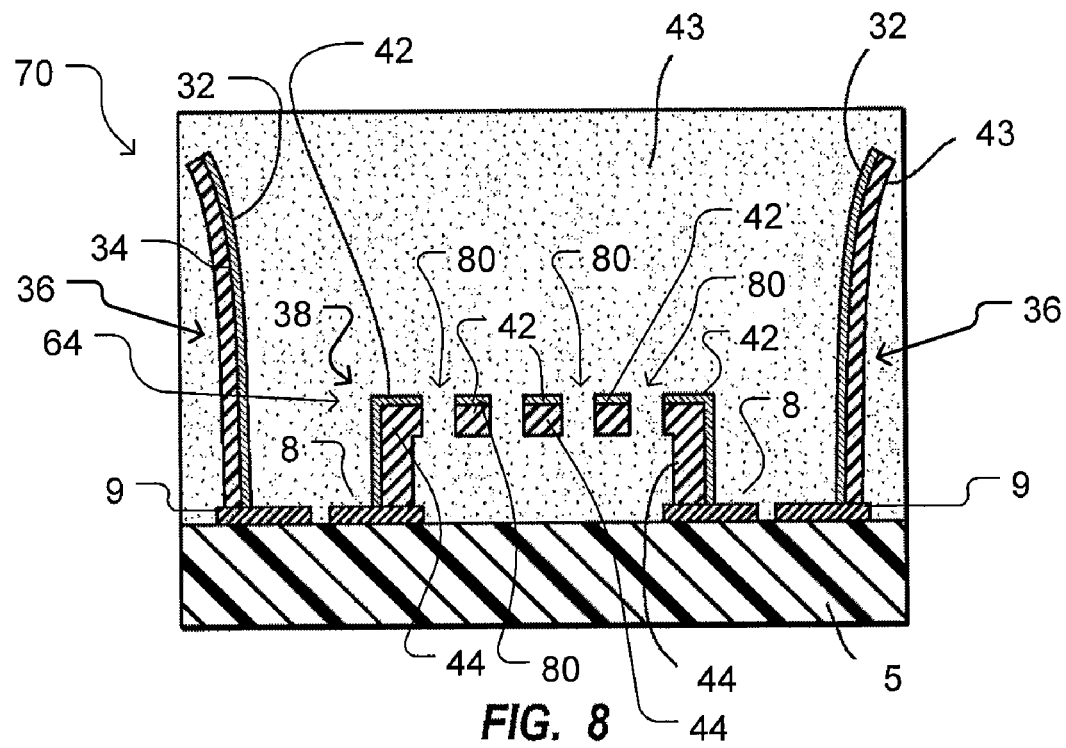
FIGS. 8 and 9 illustrate cross-sectional views of the die of FIG. 7.
Figure 9:
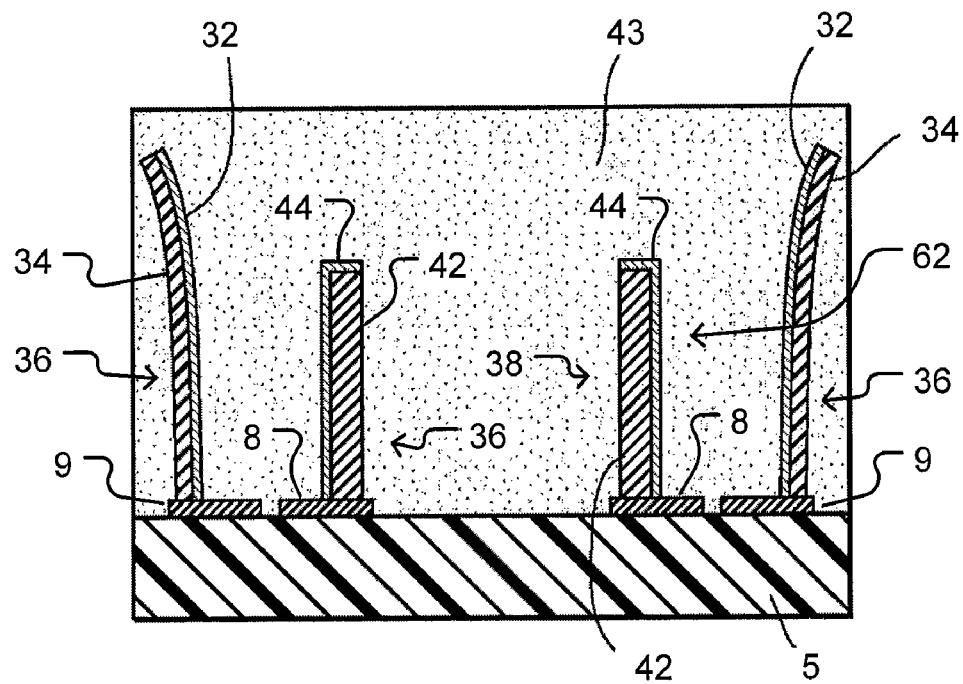
Figure 10:
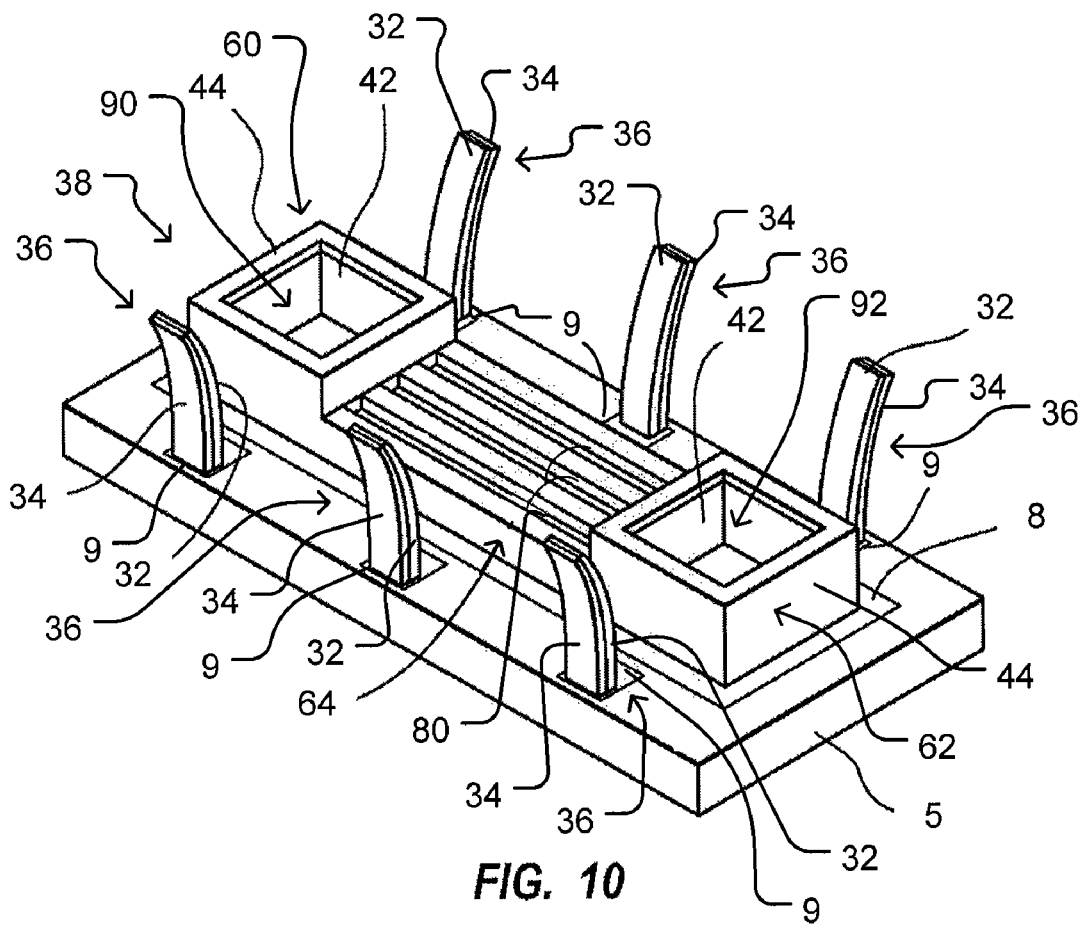
FIG. 10 illustrates the die of FIGS. 7-9 after fill droplets of the array are removed according to some embodiments of the invention.

A plurality of layers of droplets can then be deposited on the die 5, forming an array of droplets as shown in FIGS. 5-9. FIGS. 5 and 6 show the die 5 after deposition of some of the layers of droplets forming a partial array 49 of droplets, and FIGS. 7-9 show the die 5 after deposition of all of the layers of droplets forming a full array 70 of droplets on the die 5. Thereafter some of the droplets can be selectively removed, leaving others of the droplets that form support structures 36, 38, as shown in FIG. 10. As will be seen, the contacts 10 and cooling structure 20 of FIGS. 2 and 3 can be made on the support structures 36, 38.

The array 70 can include droplets comprising different materials having different properties. For example, some of the droplets in the layers can comprise materials that are soluble in a particular solvent, and others of the droplets can comprise materials that are generally insoluble in that particular solvent. As another example, some of the droplets can comprise a material or materials that are electrically conductive and others of the droplets can comprise material or materials that are not appreciable electrically conductive.

In the exemplary process illustrated in FIGS. 4-10, the layers of droplets deposited on die 5 can include droplets comprising a material or materials that are electrically conductive (hereinafter "conductive droplets"), droplets that are dissolvable in a first solvent (hereinafter "fill droplets"), and droplets that are not appreciably dissolvable in the first solvent but may be dissolvable in a second solvent (hereinafter "structure droplets"). The conductive droplets need not be appreciably dissolvable in the first solvent but can be dissolvable in the second solvent or in other solvents. Note that in FIGS. 5-9, individual droplets are not shown. However, portions of FIGS. 5-9 comprising structure droplets are cross-hatched with thick, spaced lines that slant to the right. For example, structural features 34, 44 in FIGS. 5, 6, and 7-9 comprise structure droplets. Portions of FIGS. 5-9 comprising conductive droplets are cross-hatched with thinner, more closely spaced lines that slant to the left. For example, seed layers 32, 42 in FIGS. 5, 6, and 7-9 comprise conductive droplets. Portions of FIGS. 5-9 comprising fill droplets are depicted as filled with dots and labeled with numerical identifier 43.

Examples of suitable materials for the conductive droplets include, without limitation, any electrically conductive fluid that can be deposited on top of a previously deposited layer of droplets including, without limitation, polyaniline, polythiophene and mixtures or materials containing the foregoing. A conductive ink marketed under the trade name Nanopaste by Harima Chemical, Inc. of Japan or Harima Tec, Inc. of Duluth, of California can be used as material for the conductive droplets. Other non-limiting examples of materials suitable for the conductive droplets include, without limitation, polymers (e.g. epoxies, silicones, etc.) containing conductive (e.g., metal) pieces or particles.

Examples of suitable materials for the fill droplets 43 include, without limitation, water resins (e.g. polycyclic acid, polyacrylamide, etc.) and mixtures of other materials that contain the foregoing. As another example, the fill droplets 43 can comprise a material marketed under the trade name Full Cure S-705 by Object Geometries, LTD of Rehovot Israel, or Stratasys, Inc. of Eden Prayne Minn. Examples of suitable solvents for dissolving and thus removing the fill droplets 43, without limitation, water, water mixed with an organic solvent (e.g. methanol, ethanol, icepropanol), etc.

Examples of suitable materials for the structural droplets include, without limitation polymers, polyphenylene sulphides, polyimides, polypherimides, polyether-etherketones, epoxy resins, polyetones, and mixtures or materials containing the foregoing.

In the exemplary process illustrated in FIGS. 5-10, the arrays 49, 70 include conductive droplets, structural droplets, and fill droplets. In other embodiments, droplets comprising other materials can also be used. As mentioned, FIGS. 5 and 6 show die 5 after some but not all of the layers of droplets are deposited on the die 5, and FIGS. 7-9 show the die 5 after all of the layers of droplets are deposited on the die 5. FIG. 10 shows the die 5 after the fill droplets 43 are removed to expose support structures 36, 38 on which the spring contacts 10 and cooling structure 20 of FIGS. 2 and 3 can be formed.

As can be seen in FIGS. 5 and 6, as the initial layers of droplets are deposited on the die 5 forming a partial array 49 of droplets on the die 5, structure droplets can be deposited in locations on die 5 and in the partial array 49 to form structural features 34 that define the positions and shapes of the contact structures 10 shown in FIGS. 2 and 3. Conductive droplets can be deposited to form conductive seed layers 32 on the structural features 34. As will be seen, the structural features 34 and seed layers 32 can compose support structures 36 on which the contact structures 10 of FIGS. 2 and 3 can be made.

Similarly, structure droplets can be deposited in locations on die 5 and in the partial array 49 to form another structural feature 44 that defines the position and shape of the cooling structure 20 shown in FIGS. 2 and 3. Conductive droplets can be deposited to form a conductive seed layer 42 on the structural feature 44. The structural feature 44 and seed layer 42 can compose another support structure 38 on which the cooling structure 20 of FIGS. 2 and 3 can be made.

As also shown in FIGS. 5 and 6, fill droplets 43 can be deposited in the partial array 49 where there are not structure droplets forming structural features 34, 44 or conductive droplets forming seed layers 32, 42. Note that in FIGS. 5 and 6, because only some of the layers of droplets have been deposited forming only part 49 of the array of droplets, the support structures 36, 38 are only partially completed.

As shown in FIGS. 7-9, as the layers of droplets continue to be deposited on the die 5 completing formation of the full array 70 of droplets on the die 5, structure droplets can continue to be deposited in locations on the die 5 and in the partial array 49 to complete formation of the structural features 34 that define the positions and shapes of the contact structures 10 shown in FIGS. 2 and 3, and conductive droplets can continue to be deposited to complete formation of conductive seed layers 32 on the structural features 34. As mentioned above, the structural features 34 and seed layers 32 form support structures 36 on which the contact structures 10 of FIGS. 2 and 3 can be made. Similarly, structure droplets can continue to be deposited in locations on the die 5 and in the partial array 49 to complete formation of the other structural feature 44 that defines the position and shape of the cooling structure 20 shown in FIGS. 2 and 3, and conductive droplets can continue to be deposited to complete formation of the conductive seed layer 42 on the structural feature 44. As discussed above, the structural feature 44 and seed layer 42 can compose the other support structure 38 on which the cooling structure 20 of FIGS. 2 and 3 can be made. Fill droplets 43 can continue to be deposited in the array 70 where there are not structure droplets forming structural features 34, 44 or conductive droplets forming seed layers 32, 42.

FIG. 7 shows the full array 70 of droplets deposited on the die 5, and FIG. 8 shows a cross section taken across a portion of the die 5 and the array 70 where a middle portion 64 of the support structure 38 can be formed. As will be seen, the integrated chamber 17 of the cooling system 20 of FIGS. 2 and 3 can be formed on the middle portion 64 of the support structure 38. As shown in FIG. 8, gaps 80 can be provide in the middle portion 64 of the support structure 36. The gaps 80 can allow the fill droplets 43 located between the die 5 and the structural feature 44 to be dissolved or washed away.

FIG. 9 shows a cross-section taken across a portion of the die 5 and array 70 where an end portion 62 of the support structure 38 can be formed. As will be seen, one of the ports 16 of the cooling structure 20 shown in FIGS. 2 and 3 can be formed on the end portion 62 of the support structure 38. Although not visible in FIG. 8, the array 70 can form another end portion 60 of the support structure 38 (see FIG. 10) on which the other port 15 can be formed. The end portion 60 (not visible in FIG. 8) can be generally similar to the end portion 62 of the support structure 38.

The structure, conductive, and fill droplets that comprise the array 70 of droplets can be deposited on the die 5 in any manner suitable for depositing droplets of different materials in a three-dimensional array. In a non-limiting example, automated spray heads (not shown) can be used to deposit the droplets. For example, an ink jet print head (not shown) can be used to deposit the droplets. Non-limiting examples of suitable spray heads and apparatuses for depositing droplets on a substrate, such as a die, are disclosed in U.S. patent Ser. No. 11/306,291, entitled Three Dimensional Microstructures And Methods For Making Three Dimensional Microstructures, filed on Dec. 21, 2005.

Once the layers of droplets are deposited on the die 5 forming the full array 70 as shown in FIGS. 7-9, the fill droplets 43 can be removed. For example, the fill droplets 43 can be removed by washing the array 70 with the solvent that dissolves the fill droplets 43, as discussed above. As also discussed above, that solvent can be selected so as not to dissolve or remove appreciable amounts of the structural droplets or conductive droplets that form the support structures 36, 38. Washing or removing the fill droplets 43 can leave the support structures 36, 38 as shown in FIG. 10, which shows a perspective view of the die 5 after the fill droplets 43 are removed. As shown, support structures 36, each comprising a structural feature 34 and a seed layer 32, can be left on each terminal 9 of the die 5. As mentioned, the contacts 10 of FIG. 1 can be formed on each such support structure 36. As also shown, support structure 38, comprising an end portion 62, a middle portion 64, and another end portion 60, can also be left on the die 5, and the cooling structure 20 of FIG. 1 can be formed on the support structure 38. For example, one port 16 can be formed on the end portion 62, the chamber 17 can be formed on the middle portion 64, and another port 15 can be formed on the other portion 60.

Figure 11:
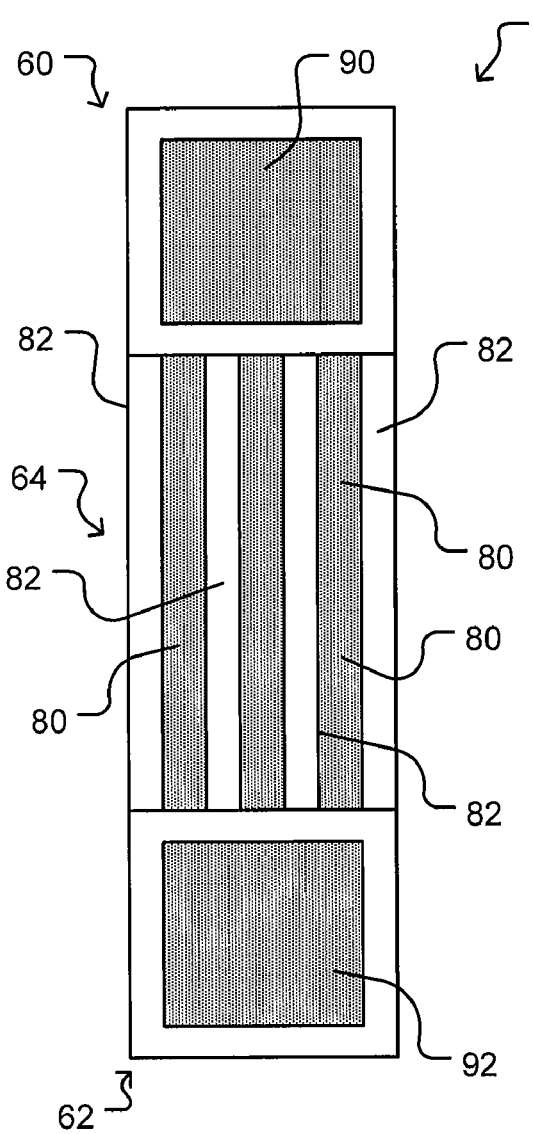
FIG. 11 illustrates a top view of a support structure of FIG. 10.
Figure 12:
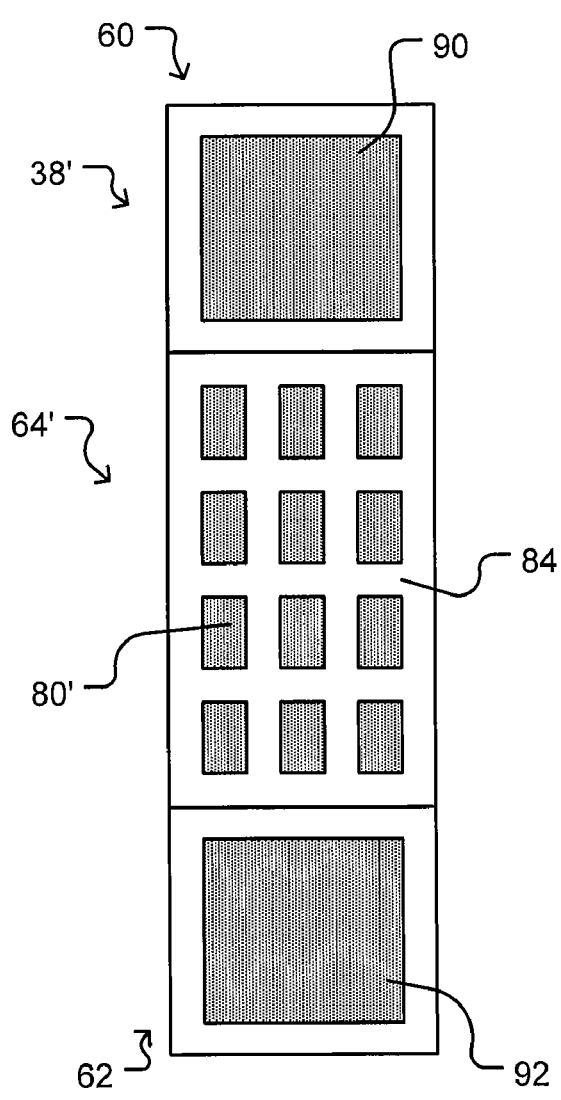
FIG. 12 illustrates a top view of an exemplary alternative configuration of the support structure shown in FIG. 11 according to some embodiments of the invention.

As shown in FIGS. 8 and 10, and as previously mentioned, gaps 80 can be provided in the middle portion 64 of the support structure 38 to facilitate washing away fill droplets 43 located between the support structure 38 and the die 5. FIG. 11 shows a top view of only the support structure 38 of FIG. 10. As shown in FIG. 11, the middle portion 64 of the support structure 38 can comprise strips, slats, or plank-like structures 82 that are spaced apart one from another, forming the gaps 80 between the structures 82. FIG. 12 illustrates an alternative configuration of the support structure 38' in which the middle portion 64' comprises a grid or lattice-like structure 84 with gaps 80'. As yet another alternative configuration of the support structure 38, the middle portion 64 need not have any gaps 80, 80'. In such a configuration of the support structure 38, fill droplets 43 located between the middle portion 64 and the die 5 can be removed through the openings 90, 92 in one or both of the end portions 60, 62 of the support structure 38.

As discussed above, the seed layers 32 of support structures 36 can comprise electrically conductive droplets. Material forming the contact structures 10 shown in FIGS. 2 and 3 can be electrodeposited or electroless deposited onto the seed layers 32 of the support structures 38 and onto the terminals 9. For example, material forming the contact structures 10 can be electroplated onto the seed layers 32 and the terminals 9 by connecting the seed layers 32 to the cathode of an electroplating system (not shown) and immersing the die 5 in a plating bath (not shown).

The seed layers 42 of the support structure 38 can likewise comprise electrically conductive droplets, and material forming the cooling structure 20 of FIGS. 2 and 3 can be electrodeposited onto the seed layers 42 and onto base 8. As the material is electroplated onto the support structure 42, the material will typically fill in the gaps 80 shown in FIGS. 8, 10, and 11 or the gaps 80' shown in FIG. 12. Thus, despite gaps 80

(or 80'), the resulting cooling structure 20 will not typically include corresponding gaps, as generally shown in the finished cooling structure 20 in FIGS. 2 and 3. Again, for example, material forming the cooling structure 20 can be electroplated onto the seed layer 42 and the base 8 by connecting the base 8 or the seed layer 42 to the cathode of an electroplating system (not shown) and immersing the die 5 in a plating bath (not shown).

Of course, material forming the contact structures 10 and the cooling structure 20 can be electrodeposited onto seed layers 32 and 42 simultaneously. For example, the seed layers 32, 42 and the terminals 9 and base 8 can be electrically connected to the cathode of an electroplating system (not shown) and the die 5 immersed in a plating bath (not shown), in which case material from the bath can plate onto the seed layers 32, 42 and the terminals 9 and base 8 generally simultaneously. To reduce the number of electrical connections that need to be made to the die 5 for such a plating procedure, the terminals 9 can be temporarily connected electrically to each other and to the base 8. For example, conductive droplets can be deposited on the die 5 in a pattern that electrically connects the terminals 9 and the base 8. Such conductive droplets can be, for example, included in the array 70 of droplets (see FIGS. 7-9) deposited on the die 5. Later, after the contact structures 10 and the cooling structure 20 are formed, the conductive droplets electrically connecting the terminals 9 and base 8 can be removed.

Once material forming the contact structures 10 and the cooling structure 20 (see FIGS. 2 and 3) has been electrodeposited onto terminals 9, base 8, and support structures 36, 38, the structural features 34, 44 of the support structures 36, 38 can be removed by washing away or dissolving the structural droplets that form the structural features 34, 44. The seed layers 32, 42 of the support structures 36, 38 can likewise be removed by washing away or dissolving the conductive droplets that form the seed layers 32, 42. Alternatively, the seed layers 32, 42 can be left in place. Regardless of whether the seed layers 32, 42 are washed away or left in place, the result can be a die 5 with integrally formed contact structures 10 and cooling system 20 as shown in FIGS. 2 and 3.

The material forming the contact structures 10 and cooling structure 20 need not be electrodeposited onto support structures 36, 38 but can be deposited by other methods. For example, material forming contact structures 10 and cooling structure 20 can be deposited using methods such as chemical vapor deposition, physical deposition, sputter deposition, electro less plating, electron beam deposition, evaporation (e.g. thermal evaporation), flame spray coating, plasma spray coating, ionic plating, etc. If a deposition method other than electrodeposition is used, the seed layers 32, 42 can be dispensed with, and the material forming the contact structures 10 and cooling structure 20 can be deposited directly onto the structural features 34, 44.

As mentioned above, the foregoing process illustrated in FIGS. 4-10 can be applied to the wafer 1 such that contact structures 10 and a cooling structure 20 are formed an all of the dies 5 of wafer 1. Thereafter, the dies 5 can be singulated from the wafer and packaged or left unpackaged. Alternatively, the process illustrated in FIGS. 4-10 can be applied to individual dies 5 after singulating the dies 5 from the wafer 1.

Figure 13:
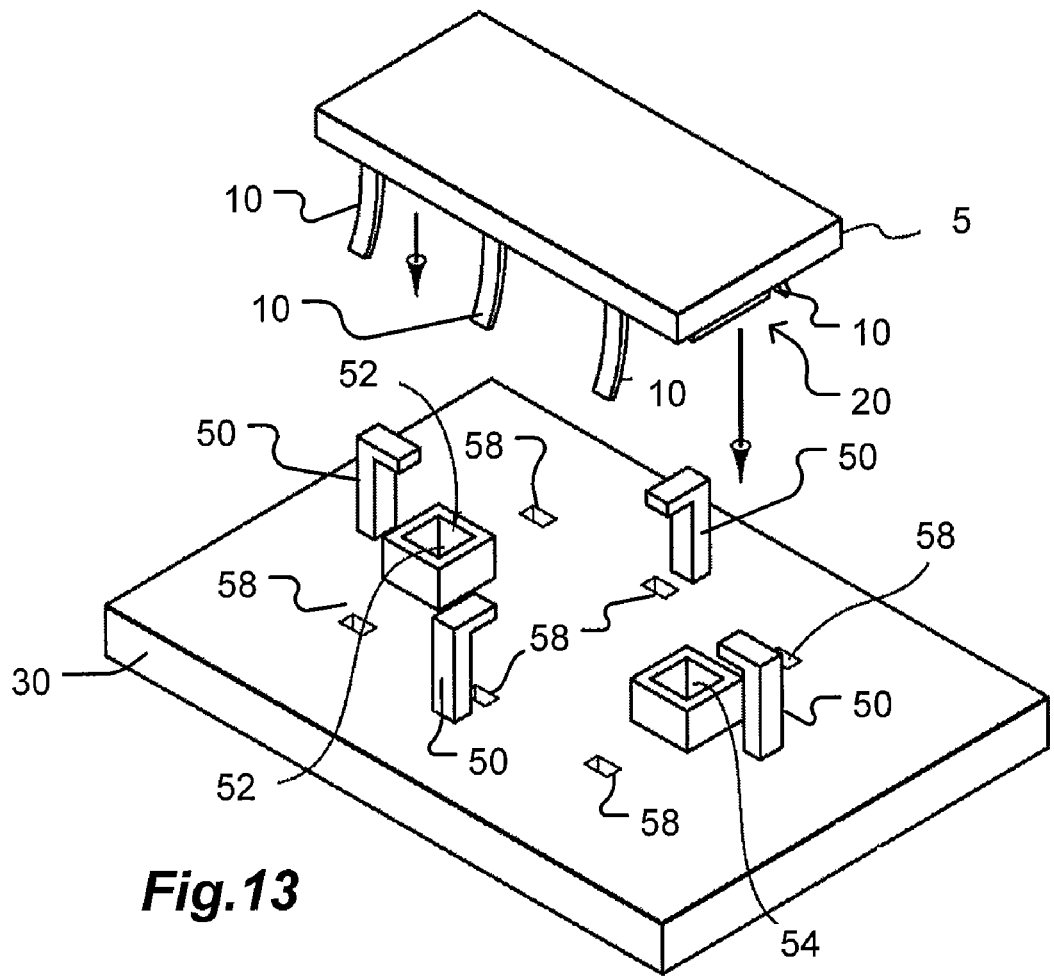
FIGS. 13-15 illustrate an exemplary wiring substrate and die according to some embodiments of the invention.
Figure 14:
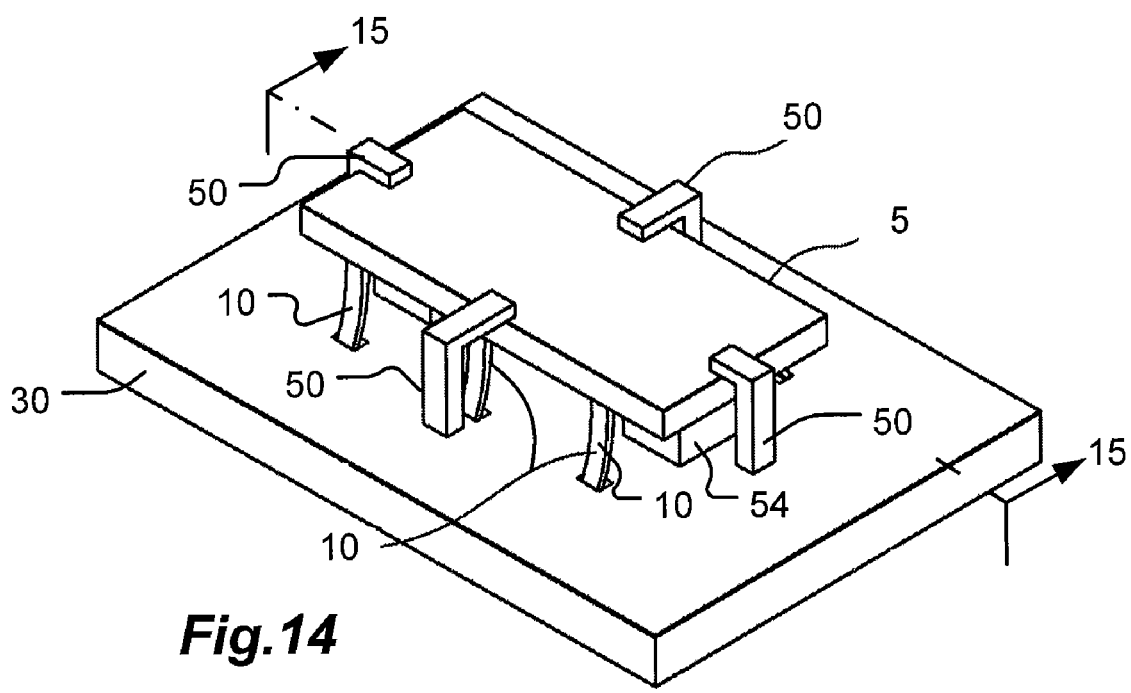
Figure 15:
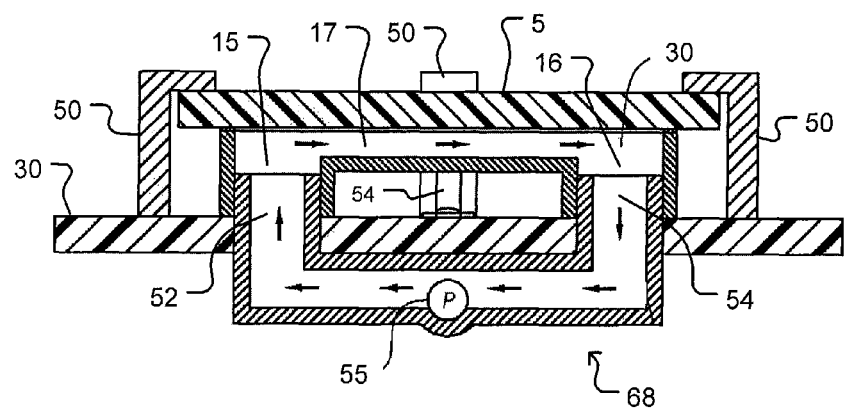

Regardless of whether the contact structures 10 and cooling structure 20 are formed on a die 5 before or after singulating the die 5 from the wafer 1, the contact structures 10—which as discussed above, can be electrically conductive—can be electrically connected to terminals 58 on a wiring substrate 30 (e.g., a printed circuit board) to which the die 5 can be attached. In examples shown in FIGS. 13-15, die 5 can be attached to a wiring substrate 30 by docking mechanisms 50. For example, docking mechanisms 50 can be kinematic, elastically averaged, or other types of docking mechanisms. The contact structures 10 of the die 5 can be pressed against and/or attached (e.g., by soldering) to terminals 58 of the wiring substrate 30. Although four docking mechanisms 50 are shown in FIGS. 13-15, more or fewer docking mechanism 50 can be used, depending upon the size and need for securing the die 5 to the wiring substrate 30. In some embodiments, the docking mechanism 50 can use kinamatic, elastic averaging, or other techniques to locate precisely the die 5 with respect to the wiring substrate 30.

As an alternative or an addition to the docking mechanisms 50, the contact structures 10 can be shaped like clips (not shown). The wiring board 30 can be configured to receive such clips (not shown), and the clips can secure the die 5 to the wiring board 30. In addition, in some embodiments, the cooling system 20 can act as a stop structure that prevents over compression of the contact structures 10, which can be spring contact structures.

Moreover, as best seen in FIG. 15, the ports 15, 16 of the cooling structure 20 on the die 5 can connect with similar ports 52, 54 of a coolant circulating system 68 that can include a micropump 55 for circulating a cooling substance (e.g., a fluid or a gas) through the cooling structure 20 on the die 5. A sealing material (not shown) can be used to seal the mechanical connections between the ports 15, 16 of the cooling structure 20 on the die 5 and the ports 52, 54 on the wiring board 30. Non-limiting examples of such sealing materials include epoxies (e.g., a B-stage epoxy). Such a sealing material can be applied to the openings of the ports 15, 16 and/or the openings of the ports 52, 54 and can form a flexible seal.

Prior to attaching die 5 to the wiring substrate 30, the die 5 can be tested. For example, the die 5 can be electrically connected through the contact structures 10 to a testing device (not shown). For example, the contact structures 10 of the die 5 can be pressed against terminals (e.g., like 58) of a wiring substrate (e.g., like 30 with or without coolant circulating system 68), which can provide an electrical interface between the testing device (not shown) and the die 5. The testing device (not shown) can then test the die 5 by writing test signals to the die 5 and analyzing response signals generated by the die 5 in response to the test signals to determine whether the die 5 functions properly. The dies 5 can be tested prior to or after being singulated from the wafer 1. After a die 5 has been tested and singulated from wafer 1, the die 5 can be attached to the wiring substrate 30 as discussed above with respect to FIGS. 13-15.

Figure 16:
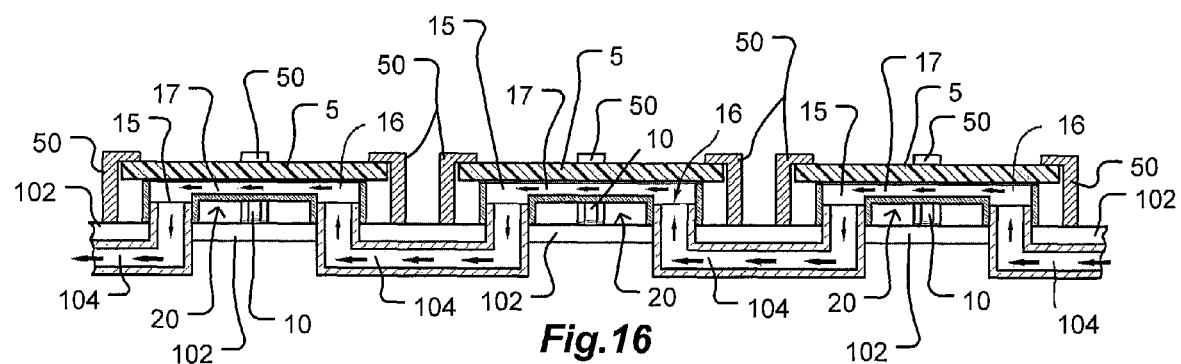
FIG. 16 illustrates a plurality of exemplary dies coupled to a wiring substrate forming an integrated cooling system according to some embodiment of the invention.

FIG. 16 illustrates an exemplary configuration in which a plurality of dies 5, each comprising a cooling structure 20, can be attached to a wiring substrate 102 (e.g., a printed circuit board) according to some embodiments of the invention. As shown, the wiring substrate 102 can include a plurality of fluid channels 104 that can connect with the cooling structures 20 of each die 5 to form a coolant channel 106 that can circulate cooling fluids or liquids across several dies 5 attached to the wiring substrate 102. Although the configuration shown in FIG. 16 shows the flow of cooling fluids in series through dies 5, the configuration can be modified such that the cooling fluid flows in parallel through the dies 5.

Figure 17:
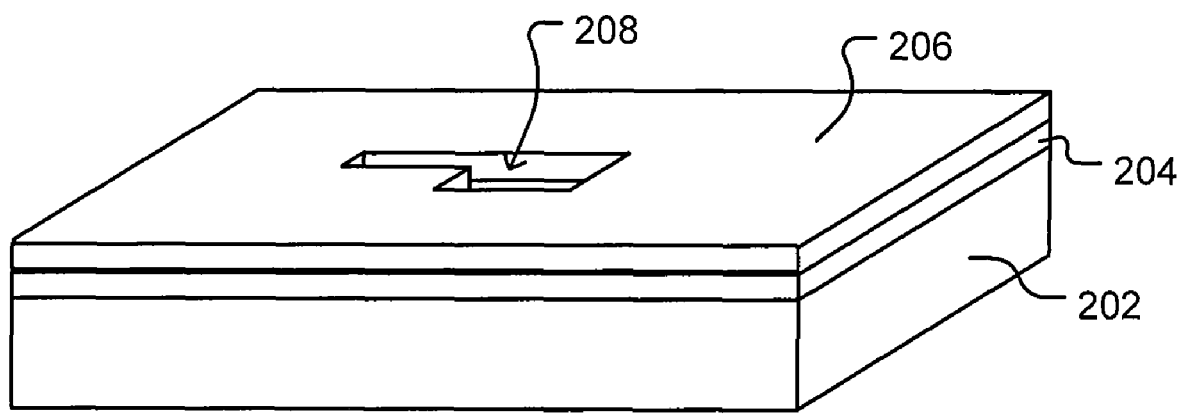
FIG. 17 illustrates an exemplary masking technique according to some embodiments of the invention.

FIG. 17 illustrates an exemplary masking technique that can be used with some embodiments of the invention. Shown in FIG. 17 is a portion of an exemplary electrically conductive seed layer 204, which can be formed by conductive droplets as discussed above. Seed layer 204 can thus be like seed layers 32, 42 discussed above. In FIG. 17, seed layer 204 is shown deposited directly on element 202, which can be a substrate (e.g., die 5), a structural feature (e.g., structural features 34, 44) formed by structure droplets, or another element. As shown in FIG. 17, a mask 206 comprising an opening 208 (one is shown but more can be included). The mask 206 can be formed by structural droplets deposited in the array 70 (see FIG. 7). As another non-limiting example, mask 206 can be formed by structural droplets deposited on a seed layer or seed layers after fill drops are removed, exposing seed layers, for example, as shown in FIG. 17. Regardless, mask 206 can be formed using generally the same material and techniques discussed above for forming structural features 34, 44. The mask 206 can mask part or parts of the seed layer 204 so that an electrodeposition or electroless deposition process deposits material not on the entire seed layer 204 but only on the portion (or portions) of the seed layer 204 exposed through the opening 208 (or openings) in the mask 206. The mask 206 can be thin, comprising one or only a few layers of structure droplets. Alternatively, mask 206 can be thicker, for example, as shown in FIG. 17, and thus form a mold structure on the seed layer 204 into which material can be deposited by electrodeposition (e.g., electroplating) or electroless plating.

Although the process of FIGS. 4-10 is illustrated and described herein as forming contact structures 10 and a cooling structure 20 on one or more semiconductor dies 5, the process can alternatively be applied to devices other than semiconductor dies and can be used to make micromechanical structures other than contact structures 10 and cooling structure 20. For example, contact structures 10 and a cooling structure 20 can be fabricated on electronic devices other than dies. As another example, the illustrated process can be used to make bio-assay chips. If utilized as a bio-assay chip, the micromechanical structure may be electroplated in a bio-compatible metal (e.g., platinum). For example, application of bio-acid chips may include the use of a micromechanical structure to produce a glucose sensor. As another example, the illustrated process can be used to make pressure sensors, microfluidic pumps, capacitor sensors, bi-stable springs for micromechanical electrical switches, and heat radiating fins on the back of a semiconductor die. As yet another example, the process illustrated in FIGS. 4-10 can be used to make the docking structures 50 shown in FIGS. 13-16, all or parts of the coolant circulating system (e.g., 52, 54, 55) shown in FIG. 15, and the fluid channels 104 of FIG. 16.

We claim:

1. An electronic device comprising:
a semiconductor die comprising an active surface on which circuitry of the die is located;
a micromechanical system integrally formed and disposed directly on the semiconductor die, wherein the micromechanical system comprises:
a plurality of electrically conductive elongate, contact structures disposed on terminals of the die; and
a cooling system disposed on the die, wherein the cooling system comprises a chamber for cooling material, and at least part of the active surface comprises part of the chamber,
wherein the terminals are disposed on the active surface of the die, and while not compressed, the contact structures extend a greater distance away from the active surface than the cooling system extends away from the active surface.

2. The device of claim 1, wherein the cooling system comprises a fluid channel, and the fluid channel comprises the chamber.

3. The device of claim 2, wherein the fluid channel comprises an inlet port to the chamber and an outlet port from the chamber.

4. The device of claim 3, wherein the micromechanical system is configured such that the inlet port joins with a first fluid port on a wiring substrate, the outlet port joins with a second fluid port on the wiring substrate, and the contact structures join with terminals on the wiring substrate.

5. The device of claim 4, wherein the die is configured to dock to the wiring substrate.

6. A device as in claim 1, further comprising a mechanical feature which prevents spring overload compression of the conductive contact structures.

7. The device of claim 6, wherein the mechanical feature which prevents spring overload of the conductive contact structures comprises the cooling system.

8. The device of claim 1, wherein:
the chamber comprises a channel for the cooling material;
the channel comprises opposite sidewalls disposed on and extending away from the active surface of the die, the channel further comprising opposite upper and lower walls, the upper wall disposed on the sidewalls away from the active surface, the at least part of the active surface being the lower wall.

9. The device of claim 8, wherein the opposite sidewalls and the upper wall are part of a structure disposed on the active surface of the die.

10. The device of claim 8, wherein the cooling system further comprises an inlet port through which the cooling material enters the channel.

11. The device of claim 10, wherein the cooling system further comprises an outlet port through which the cooling material exits the channel.

12. The device of claim 11, wherein the inlet port is located at a first end of the channel, and the outlet port is located at a second end of the channel.

13. The device of claim 1, wherein the at least part of the active surface is a part of the active surface located between a plurality of the terminals of the die.

14. The device of claim 13, wherein each of the terminals is one of a signal input terminal, a signal output terminal, or a signal input/output terminal.

15. The device of claim 1, wherein the contact structures are spring structures, and at least part of the cooling system limits compression of the spring structures.

16. The device of claim 1, wherein the cooling material is a fluid or a gas, wherein the chamber is configured to contain the fluid or the gas.

17. The device of claim 1, wherein:
the chamber includes an enclosure comprising upper, lower, and side walls, and
one of the walls comprises the active surface of the die.

18. The device of claim 1, wherein all of the micromechanical system is entirely disposed on the semiconductor die.

19. The device of claim 1, wherein the at least part of the active surface is a part of the active surface located between the terminals of the die.

20. The device of claim 19, wherein each of the terminals is one of a signal input terminal, a signal output terminal, or a signal input/output terminal.

* * * * *